United States Patent
Magno et al.

(10) Patent No.: US 9,129,552 B2
(45) Date of Patent: Sep. 8, 2015

(54) DISPLAY DEVICES USING FEEDBACK ENHANCED LIGHT EMITTING DIODE

(75) Inventors: John N. Magno, Middletown, NJ (US); Gene C. Koch, Bayville, NJ (US)

(73) Assignee: ZeoLux Corporation, Eatontown, NJ (US)

( * ) Notice: Subject to any disclaimer, the term of this patent is extended or adjusted under 35 U.S.C. 154(b) by 787 days.

(21) Appl. No.: 10/434,326

(22) Filed: May 8, 2003

(65) Prior Publication Data

US 2003/0214691 A1    Nov. 20, 2003

Related U.S. Application Data

(60) Provisional application No. 60/379,141, filed on May 8, 2002.

(51) Int. Cl.
*H05B 33/00* (2006.01)
*G09G 3/28* (2013.01)

(52) U.S. Cl.
CPC .................................. *G09G 3/2803* (2013.01)

(58) Field of Classification Search
USPC .................... 313/498–512; 257/59, 72, 88–93
See application file for complete search history.

(56) References Cited

U.S. PATENT DOCUMENTS

| | | | |
|---|---|---|---|
| 5,142,192 A | 8/1992 | Takahashi et al. | 313/506 |
| 5,365,541 A | 11/1994 | Bullock | |
| 5,406,573 A | 4/1995 | Ozbay et al. | |
| 5,537,000 A | 7/1996 | Alivisatos et al. | 313/506 |
| 5,559,400 A | 9/1996 | Nakayama et al. | 313/506 |
| 5,847,506 A | 12/1998 | Nakayama et al. | 313/504 |
| 6,072,275 A | 6/2000 | Kobashi | 313/506 |
| 6,075,317 A | 6/2000 | Keyser et al. | 313/505 |
| 6,091,195 A | 7/2000 | Forrest et al. | 313/504 |
| 6,091,197 A | 7/2000 | Sun et al. | |
| 6,097,147 A | 8/2000 | Baldo et al. | 313/506 |
| 6,142,643 A | 11/2000 | Araki et al. | 362/84 |
| 6,160,828 A | 12/2000 | Kozlov et al. | |
| 6,259,423 B1 | 7/2001 | Tokito et al. | 345/76 |
| 6,280,559 B1 | 8/2001 | Terada et al. | 156/295 |
| 6,304,366 B1 | 10/2001 | Scalora et al. | |
| 6,330,265 B1 | 12/2001 | Kinoshita | |
| 6,396,859 B1 | 5/2002 | Kopp et al. | |
| 6,404,789 B1 | 6/2002 | Kopp et al. | |
| 6,411,635 B1 | 6/2002 | Kopp et al. | |
| 6,433,355 B1 | 8/2002 | Riess et al. | 257/40 |
| 6,541,911 B1 | 4/2003 | Tanabe et al. | |
| 6,639,250 B1 * | 10/2003 | Shimoda et al. | 257/98 |
| 6,710,541 B2 * | 3/2004 | He et al. | 313/504 |

(Continued)

OTHER PUBLICATIONS

Kopp et al., "Low-threshold lasing at the edge of a photonic stop band in cholesteric liquid crystals", Optics Letters, Nov. 1, 1998, vol. 23, No. 21.

*Primary Examiner* — Joseph Williams
(74) *Attorney, Agent, or Firm* — Reed Smith LLP (57) ABSTRACT

Display devices using feedback-enhanced light emitting diodes may include active and passive matrix displays and projection displays. A light emissive element disposed between feedback elements is used as light emitting element in the display devices. The light emissive element may include organic or non-organic material. The feedback elements coupled to an emissive element allow the emissive element to emit collimated light by stimulated emission. The feedback elements that provide this function include holographic reflectors with refractive index variations that are continuous.

90 Claims, 7 Drawing Sheets

(56) References Cited

U.S. PATENT DOCUMENTS

| | | | |
|---|---|---|---|
| 6,791,261 B1 * | 9/2004 | Shimoda et al. | 313/506 |
| 6,873,099 B2 * | 3/2005 | Maeda | 313/504 |
| 2001/0033136 A1 | 10/2001 | Kawase | |
| 2001/0036212 A1 | 11/2001 | Kopp et al. | |
| 2001/0038102 A1 | 11/2001 | Kawase | |
| 2001/0043627 A1 | 11/2001 | Koyama et al. | 372/39 |
| 2002/0003827 A1 | 1/2002 | Genack et al. | |
| 2002/0018620 A1 | 2/2002 | Koyama et al. | |
| 2002/0118710 A1 | 8/2002 | Kopp et al. | |
| 2002/0131707 A1 | 9/2002 | Kopp et al. | |
| 2004/0155238 A1 | 8/2004 | Thompson et al. | |

* cited by examiner

DISPLAY DEVICES USING FEEDBACK ENHANCED LIGHT EMITTING DIODE

CROSS-REFERENCE TO RELATED APPLICATIONS

This application claims the benefit of U.S. Provisional Application No. 60/379,141 filed May 8, 2002, incorporated herein in its entirety by reference thereto. This application is related to U.S. patent application Ser. No. 10/434,941, filed on May 8, 2003, and entitled "FEEDBACK ENHANCED LIGHT EMITTING DEVICE," and U.S. patent application Ser. No. 10/431,885, filed on May 8, 2003, and entitled "LIGHTING DEVICES USING FEEDBACK ENHANCED LIGHT EMITTING DIODE," which applications are incorporated herein in their entirety by reference.

TECHNICAL FIELD

The present application relates to display devices, and particularly, to display devices using feedback enhanced light emitting diodes.

BACKGROUND

Figure 1A:
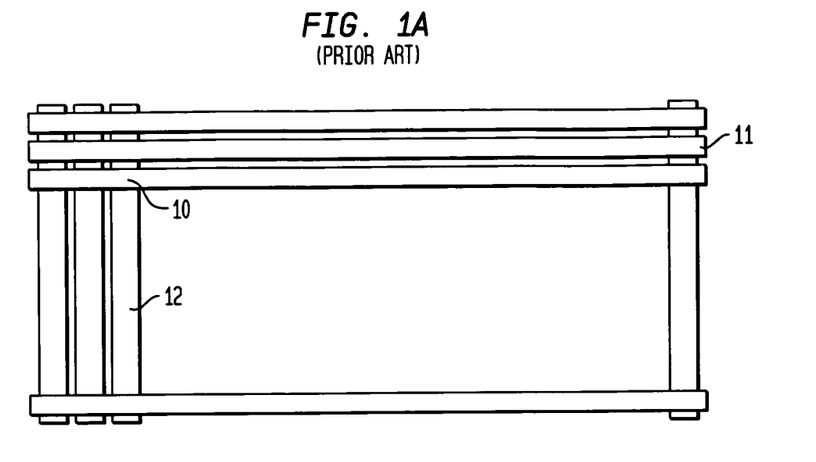
FIGS. 1a and 1b illustrate examples of prior art matrix display devices.
Figure 1B:
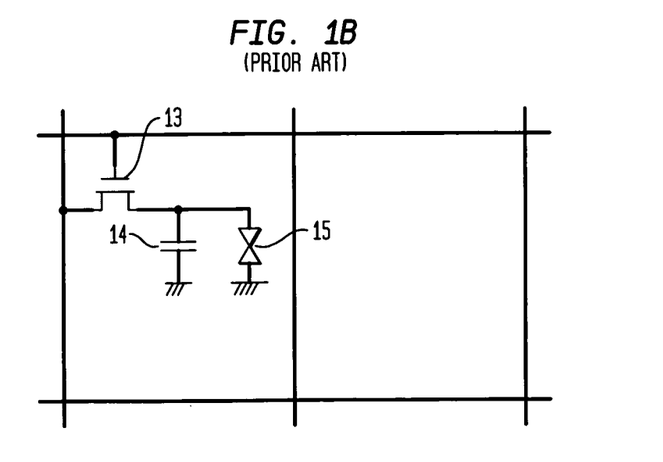

Display devices in use today typically employ liquid crystal displays (LCDs) and more recently, organic light emitting devices (OLEDs). FIGS. 1a and 1b illustrate examples of display devices such as active and passive matrix display devices and their operations briefly.

Matrix displays typically contain a grid of small picture elements (pixels), which can be switched to form characters and display graphics and video images. The electrodes are patterned as a series of stripes, with the stripes 11,12 on one glass piece running perpendicular to the stripes on the other glass piece. The electrodes are made from a transparent, conductive material, usually indium-tin oxide (ITO). Switching cells or pixels 10 are formed where the stripes overlap as shown in FIG. 1a. In liquid crystal displays, the pixels are comprised of liquid crystal material sandwiched between the electrodes. In OLEDs a series of layers of organic semiconductor material, one of which emits light on application of current, are sandwiched between the electrodes.

Passive matrix displays use a simple grid to supply the charge to a particular pixel. That is, the rows or columns are connected to integrated circuits that control when a particular column or row is biased with the proper display drive voltage. To turn on a pixel, the integrated circuit biases the correct column and the correct row with the drive voltage signals. The row and column intersect at the designated pixel, and the row and column bias voltage result in the correct voltage at that pixel.

In active matrix displays a drive scheme is used that employs a storage capacitor 14 and a transistor switch 13 at each pixel site as shown in FIG. 1b. Active matrix displays most commonly use thin film transistors (TFT). The TFTs, usually microscopic in size are arranged in a matrix on a glass substrate and connected to the row and column busses as shown in FIG. 1b. To address a particular pixel, the proper row is biased switching on the TFT gates connected to that row. Then the correct column is biased with the proper drive voltage. Since all of the other rows that the column intersects are turned off, only the storage capacitor at the designated pixel receives a charge. The storage capacitor 14 is able to store electrical charge and hold the bias voltage on the pixel 15 after the TFT gate is switched off and until the next refresh cycle. This means that the signal does not have to be refreshed as often and thus larger matrixed arrays are possible. In addition, the transistor prevents crosstalk by only switching on the pixel when the full switching voltage is applied.

The display devices including the above described matrix display devices, however, have problems associated with them such as poor viewing characteristics, for example, in high ambient illumination environments, poor visibility over wide viewing angles, and/or high power consumption. Accordingly, there is a need for more efficient display devices.

SUMMARY

Display devices using feedback-enhanced light emitting diodes are provided. A display device in one aspect comprises a luminescent device comprising at least one layer of light emissive material disposed between a first feedback layer and a second feedback layer. At least one of the first feedback layer and the second feedback layer may comprise material having at least in part periodically varying refractive index profile. An imaging element is provided proximate to the second feedback layer to allow projection of displayed images at a distance. An imaging element may comprise a projection lens, a light diverging screen, a diffusing screen or some other type of rear projection screen, or any other image forming apparatus.

A display device in another aspect comprises a luminescent device comprising at least one layer of light emissive material disposed between a first feedback layer and a second feedback layer. At least one of the first feedback layer and the second feedback layer may comprise material having at least in part periodically and continuously varying refractive index profile.

Further features as well as the structure and operation of various embodiments are described in detail below with reference to the accompanying drawings. In the drawings, like reference numbers indicate identical or functionally similar elements.

DETAILED DESCRIPTION

Display devices using feedback-enhanced light emitting diodes are disclosed. Display devices include, but are not limited, to active and passive matrix displays, and projection systems. Feedback-enhanced light emitting diode is fully disclosed in co-pending U.S. patent application Ser. No. 10/434,941 entitled "FEEDBACK ENHANCED LIGHT EMITTING DEVICE," filed on May 8, 2003. For Example, FIGS. 2 and 3 illustrate a feedback-enhanced light emitting diode in one embodiment that is used in the display devices of the present disclosure.

Figure 2:
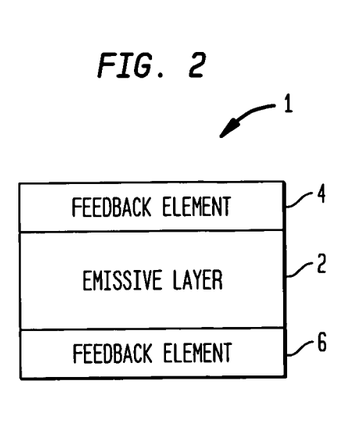
FIG. 2 illustrates an emissive device that may be used in the display devices of the present disclosure in one embodiment.
Figure 3:
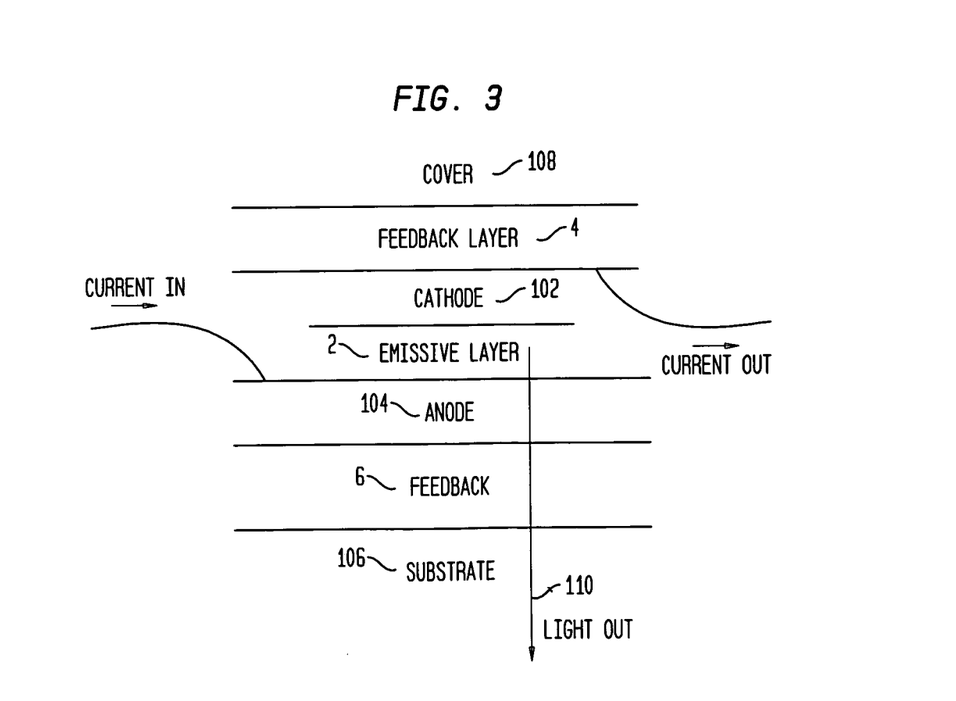
FIG. 3 illustrates a feedback-enhanced light emitting diode in one embodiment that is used in the display devices of the present disclosure.

FIG. 2 illustrates an emissive device in one embodiment. The device 1 includes an emissive layer 2 and a feedback element 4. The feedback element 4 may be a layer with at least in part periodic index of refraction variation that allows some light to be transmitted through the feedback element 4. In another aspect, the feedback element 4 may be a layer with periodic and continuous index of refraction variation. A feedback element layer with a periodic and continuous index of refraction variation is described in detail in co-pending U.S. patent application Ser. No. 10/434,941, entitled "FEEDBACK ENHANCED LIGHT EMITTING DEVICE."

A second feedback element 6 may also be included such that the emissive layer is between the two feedback elements 4, 6. The second feedback element 6 may allow some light to be transmitted through the second feedback element 6 or substantially reflect the light incident upon it. In one embodiment, a structure with a periodic index of refraction variation, a plane mirror, a distributed Bragg reflector (DBR), or another reflector may be used as the second feedback element 6.

The device in one aspect may also include other elements such a transparent buffer layer lying between the feedback layers and the emissive layer, a diffuser, an anode, a cathode or other elements. FIG. 3 illustrates an emissive device 300 having additional elements. For example, a pair of electrodes such as a cathode 102 and an anode 104 may be placed between an emissive layer 2 and the feedback layers 4 6, respectively.

The cathode 102 may include a transparent conductive structure with a low work function surface adjacent to the emissive layer 2 such that it is able to inject electrons into the emissive layer 2. In one aspect, for the cathode 102 to have the desired transparency, a two-layer cathode may be provided. The two-layer cathode may include a very thin, for example, 5 nanometer (nm.) metal cathode such that the metal is essentially transparent. The metal may then be backed, for example, on the feedback layer side, with a transparent conductor like indium-tin oxide (ITO) to yield high enough conductivity to have a low impedance device. The anode 104 may include a transparent conductive material chosen to have a high work function such that it is able to inject holes into the emissive layer 2.

The emissive layer 2 may include an electroluminescent material whose spectral emission band overlaps the reflection bands of the feedback layers 4 and 6. In one aspect, the emissive layer 2 may also be a fluorescent or phosphorescent emissive material, an emissive inorganic semiconductor material (such as GaAs, AlGaAs, or InGaN), an organometallic material, a composite organic/inorganic material, or a liquid crystalline material.

The feedback layers 4 and 6 may include light non-absorbing material with a periodically varying index of refraction. The feedback layers 4 and 6 may act as a photonic crystal that reflects light of a given wavelength band propagating along the axis labeled "light out" 110. A photonic crystal is a material that because of a periodically varying refractive index along one or more axes cannot support light propagation of particular frequencies along those axes. In sufficient thickness it thus becomes a perfect reflector over some reflection band along those axes and is said to have a photonic band gap in light energies it is incapable of supporting. Feedback layers 4 and 6 show a one-dimensional photonic band gap.

Another way of looking at this is a that the light entering the feedback layer material along the layer normal axis suffers a small reflection each time it passes through one cycle of the refractive index oscillation. When the feedback element is thick enough, the feedback element may act as a nearly perfect reflector at the resonant wavelength, 2d, where d is the pitch of the refractive index spatial oscillation.

The feedback layers in one aspect are fabricated from plane wave holograms with peak reflectivity at the desired emission wavelength.

In one aspect, the device 300 shown in FIG. 3 may be inverted. That is, the position of the cathode 102 and the anode 104 may be interchanged.

The device 300 also may include a substrate 106 placed adjacent to a feedback layer, for example the feedback layer 6. The substrate 106 is used as a layer on which the device 300 may be built. In one aspect the substrate 106 may be comprised of a transparent material. In one aspect, a material may be applied over the device 300 to function as a cover 108. The cover 108, for example, functions to hermetically seal out ambient water and oxygen, or otherwise to protect the device 300 from chemical or other degradation.

Other components of the device 300 may include a hole transport layer between the anode 104 and the emissive layer 2. The hole transport layer may be used to allow more electron/hole recombination to occur at the emissive layer 2. For example, in emissive layers having imbalance between electron and hole mobilities, usually with low hole mobilities, the electron/hole recombination tends to occur at the anode. Similarly, a device with a direct anode/emitter interface tends to be inefficient because many traps, that is, sites at which non-radiative de-excitation of the emitter occurs, exist at the emitter/anode interface. Using hole transport layers, for example, with high hole mobilities minimizes the problem of the electron/hole recombination occurring at the anode. The hole transport layer may also be chosen to have a hole conduction band intermediate between those of the anode 104 and the emissive layer 2, thus providing more efficient hole injection from the anode into the emitter.

A hole injection layer may also be provided between the anode 104 and the hole transport layer. For example, if anode materials like indium-tin oxide (ITO) having less than well defined band structures that may lead to inefficient hole injection into the device are used, hole injection layers like copper phthalocyanine may be provided to better define band structure with energy level intermediate between ITO and hole transport materials. Providing the additional hole injection layers thus may assist hole injection and produce a more efficient device.

In another embodiment, additional hole transport layers may be inserted between the hole injection layer and the emitter to further smooth out band energy differences. If the hole transport layer adjacent to the emitter has its electron conduction band at an energy level nearly the same as the emitter, electrons can "overshoot" the emitter with recombination occurring in the transport layer rather than the emitter. This overshoot may be eliminated by interposing an electron blocking layer that has a high energy electron conduction band, but good hole conduction, between the emitter and the transport layer.

In another embodiment, an electron transport layer may be provided between the cathode 102 and the emissive layer 2. The electron transport layer performs the similar function for electrons that the hole transport layer performs for holes. As with hole transport layers, additional electron transport layers may be added to assist band energy matching.

In another embodiment, an electron injection layer may be provided between the cathode 102 and the electron transport layer. Ideally, it is desirable to have as low a work function material for the cathode as possible so that energy is not expended injecting electrons into the device. Very low work function metals such as calcium may be used. Calcium, however, may be very chemically reactive and very sensitive to moisture and oxygen. Aluminum also may be used. Although aluminum has higher work function, it has been found that overcoating the aluminum with a very thin film of materials like lithium or magnesium fluoride provides a "band bending" effect that helps relieve the band energy mismatch.

In another embodiment, a hole blocking layer may be provided between the emitter and hole transport layer to eliminate hole "overshoot" from the emitter. The above described carrier transport, injection, and blocking layers are also typically used in the conventional OLED devices. Accordingly, further details of these elements will not be described herein.

In one embodiment, the device 300 may also include a buffer layer, for example, a clear dielectric interposed between an electrode and a feedback layer. When the buffer layer is placed between the cathode 102 and the feedback layer 4, it may act as a hermetic barrier between the cathode and the outside environment especially during subsequent processing. The buffer layer also may provide the right size spacing between the two feedback layers such that destructive interference of light in the gap between the two feedback layers does not occur. To achieve this function, the buffer layer may be inserted between the feedback layer and the electrode to adjust the optical thickness of the device. The buffer layer may also be used to maintain the proper phase relationship between the refractive index profiles in the two feedback layers. In addition the buffer layer may be used to adjust the thickness of the gap between the feedback layers thereby tuning the wavelengths of the modes of the light that is resonating in the gap.

The devices shown in FIGS. 1 and 2 substantially reduce or eliminate the light losses due to total internal reflections that would otherwise occur at the refractive index mismatch at boundaries. This approximately doubles the amount of light extracted from the device through the substantial elimination of light absorption loss inside of the device.

In one aspect, referring back to FIG. 2, the feedback elements 4, 6 located on either side of the emissive layer 2 form a resonant cavity. The feedback elements 4, 6 reflect light back into the material of the emissive layer 2 and allow stimulated emission to occur when sufficient light is reflected into the emissive layer 2. For example, the number of interactions between photons and excitons regulate the rate of stimulated emission. Thus, by localizing light in the resonant cavity and thus causing a high density of photons at the emissive layer 2, a very rapid stimulated emission conversion may be produced.

Typically, without the induced stimulated emission, spontaneous emission, which is a relatively slow and purely statistical process, dominates the light generation process in an emissive material. The rapid conversion of excitation energy to light by stimulated emission leaves the spontaneous emission process with little or no excited state energy to convert to light. An even slower process, non-radiative de-excitation, converts excited state energy to heat. Thus, stimulated emission preempts conversion of excited state energy to heat since the mechanism of heat formation is orders of magnitude slower than that of stimulated emission. Consequently, the excited state energy of the device 1 is converted predominantly into light, not heat. The consequent reduction in heat generation also results in reduced temperature in the device, which allows for a longer life and more efficiency in the device.

In one embodiment of a feedback enhanced light emitting display the one or more device cathodes and the one or more anodes overlay each other in a pattern such that the areas of overlap, and when properly energized, display visual information.

In matrix displays using light-emitting diodes, for example, organic light-emitting diodes, the organic light-emitting layer is generally divided into individual pixels. The pixels are generally arranged in orthogonal rows and columns and may be switched between emitting and non-emitting states by altering the current flow through them. The pixels are generally controlled via a passive or active matrix arrangement. In a passive matrix device one of the electrodes is patterned in rows and the other in columns. Each pixel may be caused to emit light by applying an appropriate voltage between the row and column electrodes at whose intersection it lies. An active matrix device employs at least one capacitor and at least one transistor at each pixel site.

Figure 4:
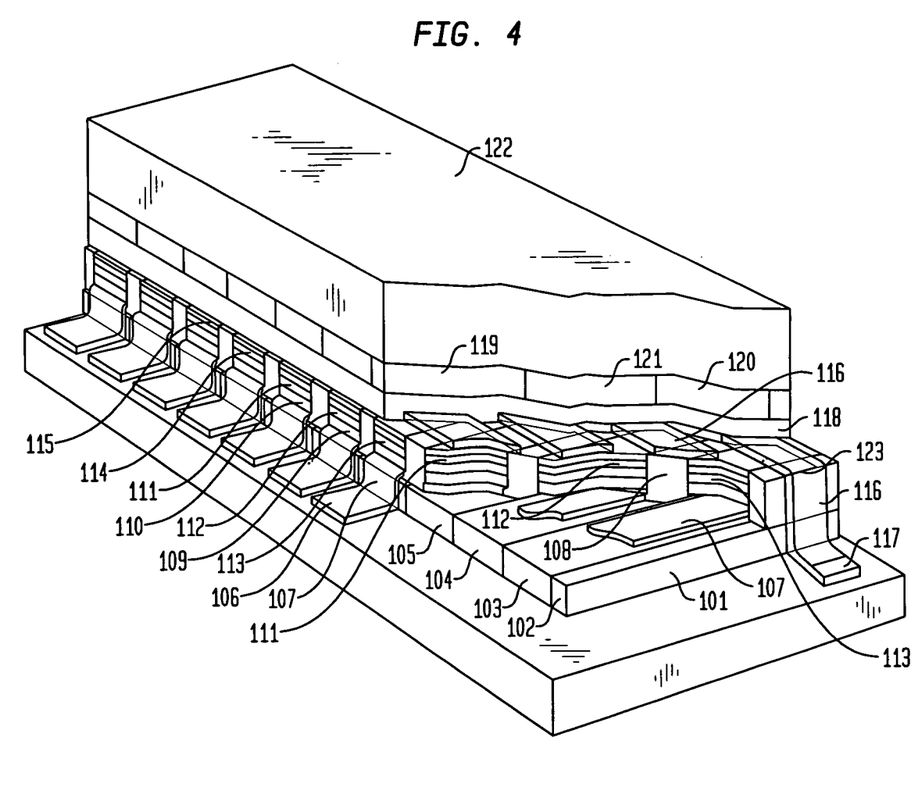
FIG. 4 illustrates an example of a color passive matrix display in one embodiment.

FIG. 4 illustrates an example of a color passive matrix display in one embodiment. The display shown is an organic light emitting diode (OLED) display using holographic feedback layers. The holographic feedback layers may be produced by applying an approximately ten micron thick layer 101 of the holographic recording material to a glass substrate 102. In this example, the material is then exposed three times to a required plane wave interference patterns through, for example, three separate photomasks to create a feedback hologram with an area for red (660 mn) light 103, an area for green (515 nm) light 104, and an area for blue (440 nm) light 105. The holographic medium is then fixed so that no further photochemical modification occurs. Next, aluminum is vacuum evaporated onto the surface of the holographic medium and patterned into anode buses 106. In one embodiment, reference element 106 may be a metallization that forms padouts at the ends of the striped ITO anodes and also provide a narrow bus that runs the length of each anode stripe along one of its edges to provide low impedence connection. Then, a layer of a transparent conductor 107, such as indium-tin oxide (ITO) is vacuum deposited on top of the holographic feedback layer. The ITO is photolithographically patterned into striped anodes lying on top of and parallel to the striped red, green, and blue feedback areas. In one embodiment, the ITO is made as thin as possible, for example, approximately 500 angstroms (Å) so as to minimize light absorption in the laser stack. The metal anode buses 106 are applied to minimize the voltage drop across the ITO.

In this example, the OLED materials are then patterned on top of the anode structure. The OLED may be composed of from one to five or more layers, for example, 109-115 of organic semiconductor. The OLED materials may be low molecular weight, polymeric, another suitable material or a combination of these materials. The low molecular weight materials may be vacuum deposited and patterned by the use of a shadow mask or by a mushroom process using patterned photoresist as an in situ shadow mask. The mushroom process is described in Society for Information Display International Symposium, May 2000, Seminar Lecture Notes, Volume 1, p. M-3/40. Polymers and some low molecular weight materials may be deposited by solvent casting. In this case, the materials may be patterned using ink jet printing.

In this example, photoresist is first applied and then patterned to form a crossover insulator 108. Next, a very thin, hole injection layer 109 of copper phthalocyanine, for example, approximately 50 Å is uniformly deposited through a shadow mask onto the red, green, and blue anodes. Without moving the shadow mask, a 350 Å layer of N, N'-Dinaphthalen-1-yl-N, N'-diphenylbenzidene (NPB) hole transport layer 110 is deposited onto the anodes. Next, a 200 Å layer 111 of parahexaphenyl (PHP) emissive layer is deposited through a shadow mask onto the blue anodes only. The green emissive layer 112 is formed by depositing a 200 Å layer of tris-(8-hydroxyquinoline) aluminum (Alq3) through a shadow mask onto the green anodes only. The red emissive layer 113 is formed by depositing a 200 Å layer of 5,10,14,20-tetraphenylporphine (TPP) through a shadow mask onto the red anodes only.

Next, the electron transport layer 114 of 450 Å of 2-(biphenyl-5-(4-tert butylphenyl)-1,3,4-oxadiazole) (PBD) is vacuum deposited through a shadow mask onto the red, green, and blue sub-pixels. Without moving the shadow mask used to deposit the electron transport layer an electron injection layer 115 of 50 Å of lithium fluoride is deposited. Next, approximately 50 Å layer 123 of aluminum is deposited through the shadow mask to form the cathode. Alternatively, a metal-free cathode structure may be formed to avoid the light absorption of even very thin layers of cathode metals that are detrimental to the lasing action of the device. The metal free cathode layer may be composed of 50 Å of bathocuproine or some other transparent conductive organic material. A more detailed discussion of a metal-free electrode can be found in G. Gu et al., Journal of Applied Physics 86, p. 4067 (1999), the entire disclosure of which is incorporated herein by reference.

On top of the aluminum, 500 Å of ITO 116 is sputter deposited through a shadow mask to form the cathode electrodes. Aluminum is evaporated onto the entire device and then patterned into cathode bus lines 117 using photolithography with a boron trichloride plasma etch. To protect OLED structures during further processing a 1000 Å thick silicon nitride layer 118 is vacuum deposited onto the entire substrate.

In this example, the device is removed from vacuum and the holographic recording material used to create the ten-micron thick feedback layer on the cathode side of the device is applied by solvent casting. In a similar manner to the film on the opposite side of the device, the feedback layer is successively patterned with an area 119 optimized for 660 nm wavelength light (red), with an area 120 optimized for 515 nm wavelength light (green), and with an area 121 optimized for 440 nm wavelength light (blue). The display is then encapsulated by application of a coverglass 122 with an epoxy peripheral seal.

In one embodiment of the present disclosure, emitter material is patterned photolithographically. In one embodiment, emitters used for patterning photolithographically include but are not limited to emitters that are photo-cross-linkable.

Figure 5:
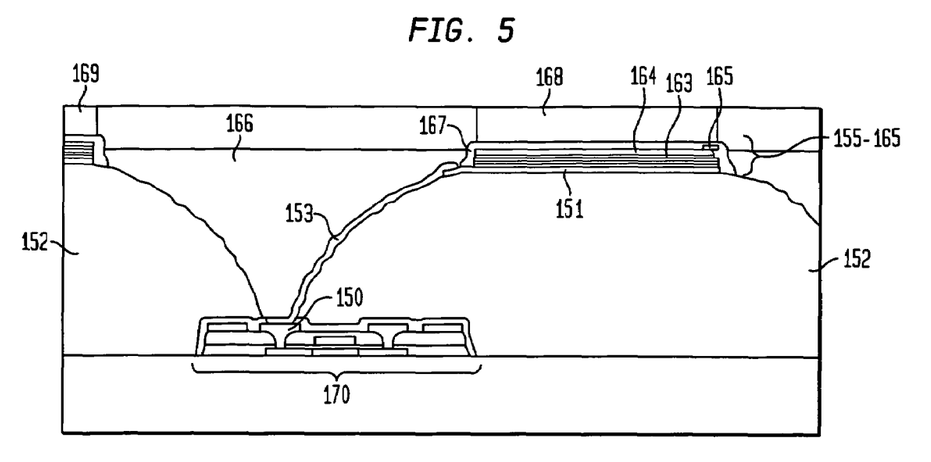
FIG. 5 illustrates an example of an active matrix display using feedback-enhanced OLED.

FIG. 5 illustrates an example of an active matrix display using a feedback-enhanced electroluminescent device. For example, a feedback-enhanced active matrix device may be fabricated like the device of FIG. 4, with the starting substrate including previously fabricated active matrix drive. The current switched drive of the active matrix may use a two or four thin film transistor (TFT) architecture or another active matrix OLED drive architecture may be used. In one aspect, the active matrix structure differs from the passive matrix structure of FIG. 4 in that the feedback layer/electroluminescent device configuration structure includes a connection of the thin film transistor (TFT) sources 150 to the corresponding pixel anodes 151. The anode feedback layer 152 is patterned so as to allow access to the TFT source metallization. The metallization (FIG. 4, 106) that follows deposition of the anode feedback layer and the anode ITO in passively addressed displays, in one embodiment, may be used to provide the pixel anode to TFT source interconnect 153. For example, metallization 106 may extend down the side of the mesa of feedback layer material 152. Thus 106 may be extended into and/or become 153. In one embodiment, the anode ITO electrode 151 is patterned into the shape of the pixel with the addition of an interconnect pad to one side instead being a continuous column or row electrode. The patterning of the feedback layer may be accomplished in a number of ways. For example, the feedback structures may be printed by ink-jet printing techniques or an alternative printing technique in one embodiment. In another embodiment, the layer may be deposited as a continuous film and then patterned lithographically. This is possible for example, because the recording material is photo-patternable. In another embodiment, the layer may be plasma etched through a lithographically patterned mask layer.

In one embodiment, the light emitting device layers 155-165 are patterned as striped layers covering a whole column of pixel elements just as they were in the passive display of FIG. 4. The cathode ITO stripes 164 and aluminum cathode buses 165 are formed as in FIG. 4, except the cathode ITO stripes 164 and the aluminum cathode buses 165 are column electrodes and buses as opposed to rows. Additionally, the display may be overcoated with a planarizing layer 166 and/or a silicon nitride protective layer 167 to insure that the feedback layer is of uniform thickness. The planarizing layer 166 and the silicon nitride protective layer 167 are applied before applying and exposing the cathode feedback layer with red 168, green 169, and blue (not shown) optimized areas.

The interconnect 153 of the active matrix, feedback-enhanced OLED display of FIG. 5 may be fabricated on the side of an approximately ten micron thick mesa of holographic recording material 152. If the side of the mesa is too much of a vertical step, there may be openings in some interconnections. In this case, an allowance for dead space between the TFT and the anode electrode so as to allow a moderate slope on the mesa edge may be included.

Figure 6:
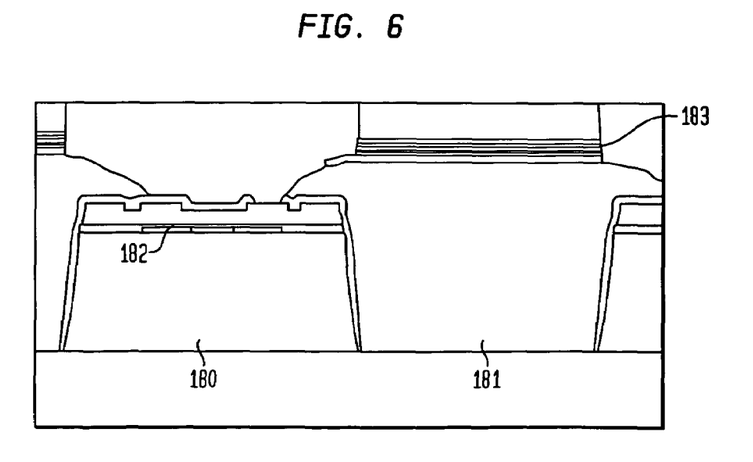
FIG. 6 illustrates an example of a feedback-enhanced active matrix OLED that includes an allowance for dead space in one embodiment.

FIG. 6 illustrates an example of a feedback-enhanced active matrix OLED that includes an allowance for dead space in one embodiment. In this embodiment, the TFTs 182, the display row and column buses are fabricated on raised ribs 180 patterned on the display glass substrate. The anode feedback layer 181 then may be patterned into roughly rectangular honeycomb depressions interspersed between an x-y grid of ribs 180. This configuration may be useful if the anode feedback layer holographic recording material is ink-jet printed since the ribs may then constrain the deposited droplet of recording material solution from spreading. If the ribs 180 are extended a little higher, the ribs 180 also may be used to contain droplets of solution from ink-jet printed light emitting device layer components 183.

The ribs 180 may be photolithographically patterned on the glass substrate from a high temperature resistant polymer or from sol-gel glass. It is also possible to pattern the ribs 180 from a thick metallization layer overcoated with an insulating material, for example, to avoid shorting. In this structure, the metal rib cores may be used for heat dissipation in displays with intense thermal loads, for instance, in projection displays.

In another embodiment, display resolutions may be improved by building the TFT matrix on top of an already deposited and exposed holographic feedback layer using a very low temperature polycrystalline silicon TFT process such as used with flexible polymer substrates. Examples of very low temperature process can be found in C. S. McCormick, C. E. Weber, J. R. Abelson, and S. M. Gates, "An amorphous silicon thin film transistor fabricated at 125 degrees Celsius by dc reactive magnetron sputtering," Appl. Phys. Lett., Vol. 70, no. 2, pp. 226-7 and P. M. Smith, P. G. Carey, and T. W. Sigmon, "Excimer laser crystallization and doping of silicon films on plastic substrates," Appl. Phys. Lett., Vol. 70, no. 3, pp. 342-344, 1997.

In this method of producing a feedback enhanced OLED, the stimulated emission produced feedback enhancement does not strongly depend on the thickness uniformity of the OLED display device semiconductive or conductive layers, their parallelism, or their surface finish because the lasing action is defined by the phase relationship of the feedback layers. In the case of holographic feedback layers, maintenance of the correct phase relationship between the two feedback layers may be ensured by the phase-locking methods described in a copending application entitled "FEEDBACK-ENHANCED LIGHT EMITTING DEVICE." This ensures that the set of interference fringes created in space by the exposure apparatus is aligned with one feedback layer while the other feedback layer is recorded.

The active matrix thin film transistors 170 in FIG. 5 may be formed from conventional Poly-SI TFTs in one embodiment. In another embodiment, the active matrix element may be formed from other kinds of three terminal switching elements. In another embodiment, materials used for forming the TFTs or other switching elements may have amorphous or single crystal structure and may be formed from materials other than silicon.

Figure 7:
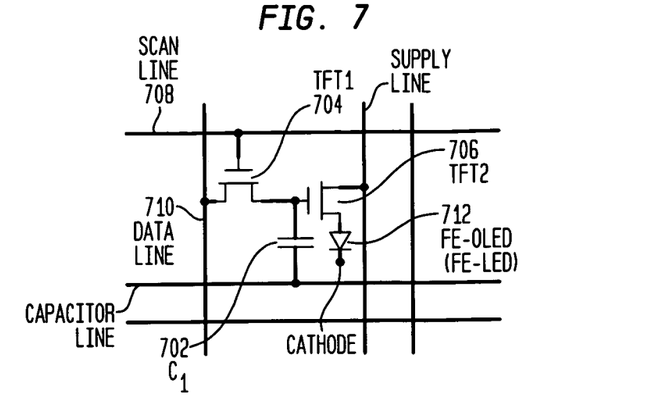
FIGS. 7 and 8 illustrate examples of an active matrix drive in several embodiments of the present disclosure.
Figure 8:
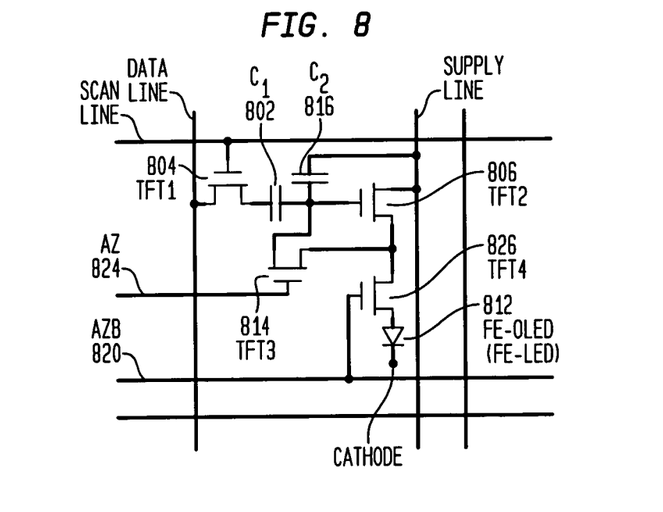

FIGS. 7 and 8 illustrate examples of an active matrix drive in several embodiments of the present disclosure. Each pixel element in a multi-row FE-OLED display of the present disclosure may be addressed with a drive signal continuously. As shown in FIG. 7, the active matrix drive in one embodiment comprises two thin film transistors (TFTs) 704, 706, a storage capacitor 702, and an FE-OLED device 712 at each pixel site. The source electrode of the TFT 704 is connected to a data line 710 and the drain electrode of the TFT 704 is connected to the gate electrode of the TFT 706. The gate electrode of the TFT 706 is connected to the storage capacitor 702. The FE-OLED device 712 is connected to the drain electrode of the TFT 706. A scan line 708 allows pixels in individual display rows to be addressed one row at a time. When the gate of TFT 704 is enabled data line 710 establishes the gate bias voltage on TFT 706. This bias in turns meters current flow through TFT 2 706 from source to drain thus establishing the current level in the light emitting device or OLED pixel and controlling the level of light output from the pixel based on the luminance versus current characteristic of the device. The TFTs 704 706 provide a current to the device 712, for example, a FE-OLED device and serve as an active driving device. The capacitor 702 stores the driving signal charge.

FIG. 7 shows a simple two transistor configuration scheme for latching a desired grayscale current level into an OLED active matrix pixel. In another embodiment, a four transistor autozeroing pixel drive configuration shown in FIG. 8 may be used. This configuration may be used, for example, in cases in which TFT to TFT variation in polycrystalline silicon active driving matrices may lead to pixel to pixel variation in current level for the same gate bias on transistor. the (See R. Dawson, et al., "Design of an Improved Pixel for a Polysilicon Active-Matrix Organic LED Display", SID International Symposium Proceedings, 1998, p.11; R. Dawson, et al., "The Impact of the Transient response of Organic Light Emitting Diodes on the Design of active Matrix OLED Displays", IEEE International Electron Device Meeting, 1998, p.875; R. Dawson, et al., "A Poly-Si Active-Matrix OLED Display with Integrated Drivers", SID International Symposium Proceedings, 1999, p.438; R. Dawson and M. Kane, "Pursuit of Active Matrix Organic Light Emitting Diode Displays", SID International Symposium Proceedings, 2001, p.372).

Here the addition autozero (AZ) 824 and autozero bar (AZB) 820 lines and transistors TFT 3 814 and TFT 4 826 allow measurement of variations in the threshold of TFT 2 806 before the gate of TFT 1 804 is enabled to allow the data voltage to bias the gate of TFT 2 806. Storage of the threshold voltage in capacitor C1 816 then allows the gate bias of TFT 2 806 to be offset to allow for threshold voltage variation. The above described active matrix addressing configurations using TFTs are typically used in conventional active matrix OLED devices. (See for instance, Fish, et al., "A Comparison of Pixel Circuits for Active Matrix Polymer/Organic LED Displays", SID International Symposium Proceedings, 2002, p.968; and S. Tam, et al., "Poly-Si Driving Circuits for Organic EL Displays", Paper 4925-20, Conference 4925A, Electronic Imaging 2001) Accordingly, further details of these elements will not be described herein.

In one embodiment, the matrix addressing scheme in the OLED display devices of the present disclosure allows for maintaining constant current on a selected pixel element. Various constant current levels may be maintained on pixels to support gray scale operations. Such gray scale operation may be performed by active matrices fabricated from polycrystalline silicon or single crystal silicon materials. The gray scale modulation is accomplished by a combination of analog current adjustment and/or time modulation of drive current at individual pixels during each addressing timeframe of the graphic information.

Figure 9:
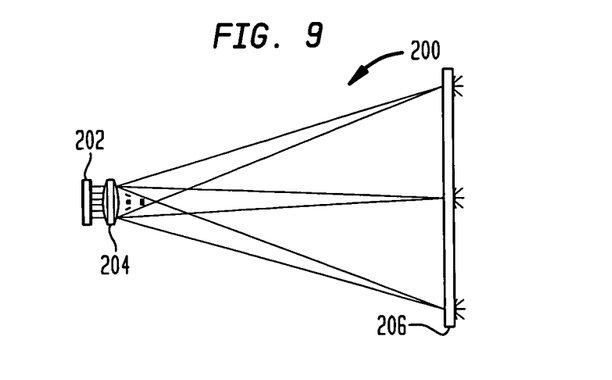
FIG. 9 illustrates a projection system including the OLED in one embodiment.

In another embodiment, display devices in the present disclosure may projection systems that use feedback enhanced light emitting device. Such projection systems may include but are not limited to display monitors and televisions. FIG. 9 illustrates an example of a projection system 200 that includes an FE-OLED micro-laser array 202, for example, with a projection lens 204 to project an image on a screen 206 according to another embodiment of the present disclosure. FIG. 9 is illustrated with using an FE-OLED device as an example. The device shown in FIG. 9 also may use other feedback enhanced light emitting devices, and are not limited to light emitting devices using an organic material. A projection system that includes a micro-laser array 202 simplifies the projection optics of the projection since substantially collimated image light is generated. This may obviate the need for expensive collimation optics with all of the associated problems and reduce number of components in the projection system 200. The reduced number of components substantially reduce the cost, complexity and size of the projection system 200. The projection system of this embodiment also may not need an additional color separation apparatus used in projection systems, for example, films, color wheels, and the like. The projection lens 204 may be replaced by more sophisticated projection optics such as a compound lens or lens system, for example, to eliminate aberrations and other unwanted artifacts in the projected image. Furthermore, additional optics, for example, mirrors, may be introduced between the projection lens and the screen to fold the projection path such that the entire system may be contained in an enclosure of small size.

Figure 10:
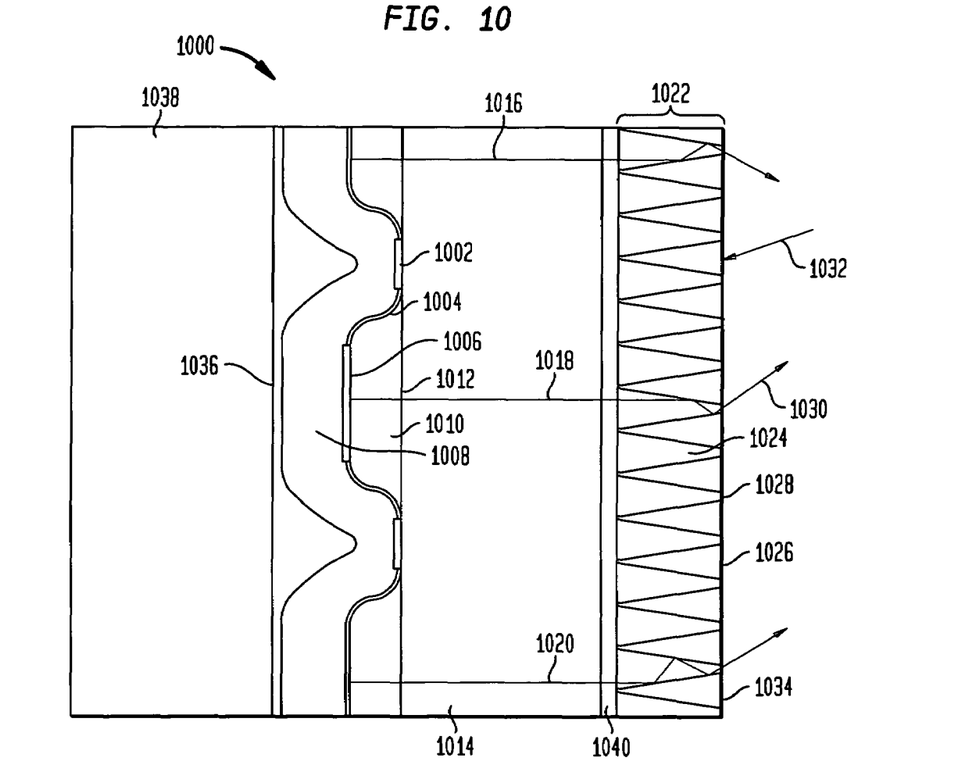
FIG. 10 illustrates a laser projected image exiting an OLED array and immediately entering the screen structure creating an image on the screen front surface of the rear projection screen in an active matrix device.
Figure 11:
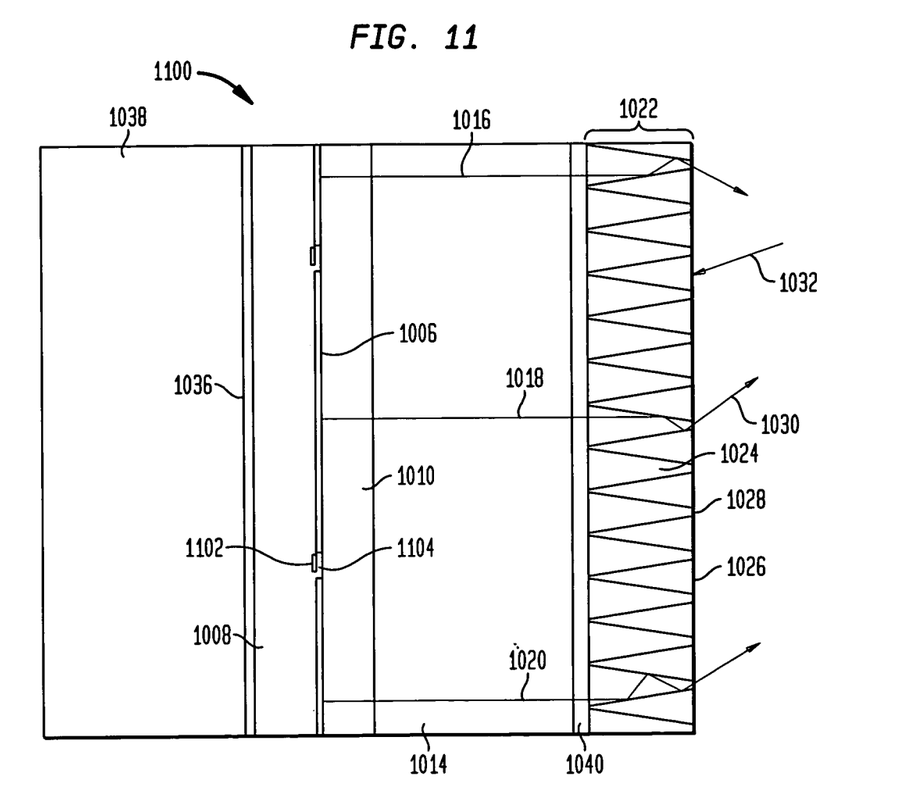
FIG. 11 illustrates a laser-projected image exiting an OLED array and immediately entering the screen structure creating an image on the screen front surface of the rear projection screen in a passive matrix device.

FIGS. 10 and 11 illustrate direct-view flat panel displays utilizing FE-OLEDs in which a laser projected image exiting an OLED array and immediately entering the screen structure creating an image on the screen front surface of the rear projection screen. As in FIG. 9, FIGS. 10 and 11 illustrate examples using FE-OLEDs. The devices shown in FIGS. 10 and 11 also may use other feedback enhanced light emitting devices, and are not limited to light emitting devices using an organic material. FIG. 10 illustrates an active matrix device while FIG. 11 illustrates a passive matrix device. The rear projection screen may be a rear projection screen built according to U.S. Pat. Nos. 5,563,738 and 5,481,385. In one embodiment, the projection screen may be placed a small distance away from the emissive device. This may be useful in providing mechanical design flexibility in display installation. The projection screen may be of the scattering type, refractive or diffractive types or any combination thereof.

In the example of a direct-view active matrix FE-OLED display 1000 shown in FIG. 10, a TFT-based pixel drive circuit 1002, for instance, described with reference to FIG. 8 provides drive current through an anode bus 1004 to an OLED structure 1006 disposed between two feedback layers, the back feedback layer 1008 and the front feedback layer 1010. The two feedback layers (1008 and 1010) form part of a feedback enhanced light emitting device, for example, an FE-OLED. Light from the OLED structure 1006 is emitted out of the front surface 1012 of the front feedback layer through front coverglass 1014. In the figure blue light 1016, red light 1018, and green light 1020 are emitted from three different adjacent FE-OLED structures that are configured to emit red, green, and blue light respectively. In this way a color matrix display may be built up. Light, for example, 1018, is incident on the rear surface of a rear projection screen 1022.

The screen comprises an array of tapered micro-light guides 1024 comprised of an optically transparent material. The interstitial areas between the light guides are filled with a black-filled resin 1026, for instance, filled with carbon black, that has a lower refractive index than the micro-light guide material. As a result light 1018 is multiply reflected out through the light guides and out through the light guide tips 1028. The geometry of the reflections, and for example, optionally roughening of the light guide tips, leads to a wide angular dispersal of the light 1030 exiting the screen. The screen 1022 may be bonded to the FE-OLED array by an adhesive 1040 or separated from it by an air gap.

This direct-view active matrix FE-OLED display may be used under high ambient illumination because ambient light 1032 striking the front surface of the display assembly may be highly likely to be absorbed in the black resin 1026 that constitutes on the order of 90% of the front surface 1034 of the screen. The small amount of ambient light that does pass through the light guide tips 1028 for the most part enters the FE-OLED structure through surface 1012. Feedback layers 1008 and 1010 may be designed to have spectrally narrow reflection bands. Therefore, less than half the light striking surface 1012 is directly reflected back towards screen 1022 and the display viewer. The remainder of the light transits the FE-OLED and impacts potting material 1036 that fills the space between the FE-OLED and the back substrate 1038. Potting material 1036 may be filled with a black filler so that the remaining ambient light that impinges it is almost completely absorbed. The light absorbing function of potting material 1036 may also be achieved by a thin layer of light absorbing material deposited between potting material 1036 and the FE-OLED structure. A black matrix material may also be deposited over the top of the active matrix pixel drive circuit 1002 to further enhance ambient light absorption.

A result of the highly efficient absorption of ambient light by the display structure in FIG. 10 may mean that the display has what is called a "dead front" that reflects almost no ambient illumination. This in turn means that the display will be easily readable under very high levels of ambient illumination even if the display drive current turned down to the low levels that lead to long service life.

The direct-view passive matrix FE-OLED display 1100 shown in FIG. 11 comprises components that function similarly to the components described with reference to FIG. 10. In FIG. 11, a matrix of anode bus lines 1102 and cathode bus lines 1104 may be used in place of the TFT pixel drive circuitry shown in FIG. 10. The OLEDs 1006, the feedback layers 1006 and 1008, the substrates 1014 and 1038, and the various components in the rear projection screen 1022 function similarly as described with reference to FIG. 10. The interaction of the display 1100 with incoming ambient light 1032 also is similar.

The embodiments described above are illustrative examples and it should not be construed that the present disclosure is limited to these particular embodiments. Various changes and modifications may be effected by one skilled in the art without departing from the spirit or scope of the invention as defined in the appended claims.

We claim:

1. A display device, comprising:
a first feedback layer adapted to receive and reflect light;
one or more first electrode strips formed over the first feedback layer;
one or more semiconducting layers formed over the first electrode strips, at least one of the one or more semiconducting layers comprising at least a luminescent material;
one or more second electrode strips formed over the luminescent material the second electrode strips being formed such that they overlay one or more of the first electrode strips, wherein an area where the first electrode strip and the second electrode strip overlap comprises a segment area capable of being driven via the first electrode strips and the second electrode strips;
a second feedback layer adapted to receive and reflect light disposed over the one or more second electrode strips; and
an imaging element disposed proximate to one of the first feedback layer and the second feedback layer;
wherein one or both of the first feedback layer and the second feedback layer has a refractive index profile that varies at least in part periodically alone an axis normal or substantially normal to a plane of a respective feedback layer; and
wherein one or both of the first feedback layer and the second feedback layer comprises at least a layer of holographic recording material.

2. The device of claim 1, wherein the overlay areas of the first electrode strips and the second electrode strips comprise at least a rectilinear matrix of display pixels.

3. The device of claim 1, wherein one or both of the first feedback layer and the second feedback layer comprise at least a layer with a photonic crystal structure.

4. The device of claim 1, wherein a distance between the first feedback layer and the second feedback layer is such that the space between the feedback layers constitutes a cavity in which light of one or more desired wavelengths constructively interfere.

5. The device of claim 1, wherein light reflected by one or both of the first feedback layer and the second feedback layer stimulates emission of light from the one or more layers of luminescent material.

6. The device of claim 5, wherein the stimulated emission of light results in substantial collimation of light emitted by the device.

7. The device of claim 5, wherein the stimulated emission of light results in laser action.

8. The device of claim 1, wherein the luminescent material comprises an organic luminescent material.

9. The device of claim 8, wherein the organic luminescent material comprises a polymeric material.

10. The device of claim 8, wherein the organic luminescent material comprises an oligomeric material.

11. The device of claim 8, wherein the organic luminescent material is photo-cross-linked.

12. The device of claim 1, wherein the luminescent material comprises an organometallic material.

13. The device of claim 1, wherein the luminescent material comprises an inorganic material.

14. The device of claim 1, wherein the luminescent material comprises an inorganic and organic composite material.

15. The device of claim 1, wherein one or both of the first and the second feedback layers comprises at least a layer of holographic recording material disposed on a substrate.

16. The device of claim 3, wherein one or both of the photonic crystal structures include one-dimensional, two-dimensional, or three-dimensional photonic crystal structures or combination thereof.

17. The device of claim 1, wherein one or both of the first feedback layer and the second feedback layer comprise at least a layer of holographic recording material with a recorded plane wave interference pattern.

18. The device of claim 1, wherein the luminescent material comprises pure material, a solid solution, an alloy, or inhomogeneous mixture, or combination thereof.

19. The device of claim 1, wherein the luminescent material is patterned into areas that are spatially registered with the segment areas.

20. The device of claim 19, wherein the patterned areas are discrete patterned areas.

21. The device of claim 20, wherein the discrete patterned areas comprise two or more luminescent material compositions, each of the discrete patterned areas comprising one of the two or more luminescent material compositions and each of the two or more luminescent material compositions emitting a different spectral band of visible light.

22. The device of claim 1, wherein a spectral reflection band of one or both of the feedback layers substantially overlaps a spectral emission band or bands of the luminescent material.

23. The device of claim 22, wherein one or both of the feedback layers are patterned into areas such that each area has one of two or more periods of refractive index alternation corresponding to different spectral reflection bands representing different colors of reflected light.

24. The device of claim 23, wherein the areas are discrete areas.

25. The device of claim 23, wherein both of the feedback layers have substantially periodic refractive index profiles.

26. The device of claim 25, wherein the corresponding areas in one feedback layer are of substantially the same shape and size as those in the other feedback layer and are spatially registered on them.

27. The device of claim 25, wherein the corresponding areas in the two feedback layers have spectral reflection bands that substantially overlap each other.

28. The device of claim 25, wherein the patterned areas of the luminescent material comprise two or more luminescent materials, each patterned area comprising one of the two or more luminescent materials, each of the luminescent materials emitting a different spectral band of visible light.

29. The device of claim 28, wherein the patterned areas of the luminescent material are discrete patterned areas.

30. The device of claim 28, wherein the patterned areas of the luminescent material correspond to the patterned areas in one or both of the feedback layers.

31. The device of claim 30, wherein the patterned areas of the luminescent material are of substantially the same shape and size as the corresponding patterned areas in the feedback layers or of the combination of one or more of the corresponding patterned areas in the feedback layers.

32. The device of claim 31, wherein spectral emission bands of the patterned areas in the luminescent material at least partially overlap the spectral reflectance bands of corresponding patterned areas in one or both of the feedback layers.

33. The device of claim 2, wherein the luminescent material is patterned into areas, the patterned areas being spatially registered with the matrix of pixels.

34. The device of claim 33, wherein the patterned areas comprise discrete patterned areas.

35. The device of claim 33, wherein the luminescent material is photo-cross-linkable and patterned by a patterned exposure.

36. The device of claim 33, wherein the patterned areas of the luminescent material comprise two or more luminescent materials, each patterned area comprising one of the two or more luminescent materials, each of the two or more luminescent materials emitting a different spectral band of visible light.

37. The device of claim 1, wherein a spectral reflection band of one or both of the feedback layers substantially overlap the spectral emission band or bands of the luminescent material,
and wherein the overlay areas of the first and second electrode strips comprise a rectilinear matrix of display pixels.

38. The device of claim 37, wherein both of the feedback layers have substantially periodic refractive index profiles and are patterned into areas, each area having one of two or more periods of refractive index alternations corresponding to different spectral reflection bands,
the corresponding areas in both the feedback layers being of substantially the same shape and size and map onto the rectilinear array of pixels in the luminescent material,
the corresponding areas in the feedback layers having spectral reflection bands that substantially overlap each other.

39. The device of claim 37, wherein the pixel areas of the material in the rectilinear pixel matrix comprise two or more luminescent materials, each pixel area comprising one of the two or more luminescent materials, each of the two or more luminescent materials emitting a different spectral band of visible light, the pixel areas of the luminescent material corresponding to the patterned areas in one or both of the feedback layers, the pixel areas in the luminescent material being of substantially the same shape and size as the corresponding areas in the feedback layers or of the combination of one or more of the corresponding areas in the feedback layers, a spectral emission bands of the patterned areas in the material at least partially overlapping a spectral reflectance bands of corresponding areas in the feedback layers.

40. The device of claim 37, wherein one or both of the feedback layers that have substantially periodic refractive index profiles are patterned into discrete pixel areas such that each pixel area has a period of refractive index alternation corresponding to a spectral reflection band corresponding to one of red, green, and blue reflected light, and the red, green, and blue light emitting pixel areas alternate forming a dot-matrix image source capable of displaying full-color graphics.

41. The device of claim 39, wherein the patterned pixel areas in both the feedback layers and the luminescent material are configured to emit one of red, green, and blue light, the red, green, and blue light emitting pixel areas arranged alternatingly and forming a dot-matrix image source capable of displaying full-color graphics.

42. The device of claim 40, wherein the alternating red, green, and blue pixel areas combine to form red, green, and blue vertical stripes across the device.

43. The device of claim 40, wherein the alternating red, green and blue pixel areas are clustered to form color triads across the device.

44. The device of claim 41, wherein the luminescent material whose spectral emission band is optimized for blue wavelengths of light comprises parahexaphenyl.

45. The device of claim 40, wherein the luminescent material whose spectral emission is optimized for green wavelengths of light comprises tris-(8-hydroxyquinoline) aluminum.

46. The device of claim 40, wherein the luminescent material whose spectral emission is optimized for red wavelengths of light comprises 5,10,14,20-tetraphenylporphine.

47. The device of claim 1, wherein the first electrode strips comprise a transparent, high work function material that functions as an anode injecting holes into the adjacent semiconducting layer.

48. The device of claim 47 wherein the transparent, high work function material comprises indium-tin oxide.

49. The device of claim 1, wherein the second electrode strips comprise a low work function material that functions as a cathode injecting electrons into the adjacent semiconducting layer.

50. The device of claim 1, wherein the second electrode strips comprise a highly reflective metal and serves as the second feedback layer.

51. The device of claim 1, wherein the second electrode strips comprise a transparent material.

52. The device of claim 1, wherein the second electrode strips comprise a first, very thin metal layer adjacent to the semiconducting layer and a second thicker layer comprising a transparent conductive material.

53. The device of claim 52, wherein the transparent conductive material comprises indium-tin oxide.

54. The device of claim 1, wherein light emitted by the device occupies two or more light propagation modes.

55. The device of claim 1, wherein one or both of the first feedback layer and the second feedback layer comprises refractive index profiles that have superimposed multiple periodic spatial frequencies of variation.

56. The device of claim 1, wherein both the first feedback layer and the second feedback layer transmit no light at a peak wavelength of their spectral reflection bands and the light emissive material radiates light into band-edge laser modes.

57. The device of claim 1, further including a transparent cover disposed between the second electrode strips and the second feedback layer.

58. The device of claim 1, further including a substrate over which the first feedback layer is disposed.

59. The device of claim 58, wherein the substrate comprises a glass substrate.

60. The device of claim 58, wherein the substrate comprises one or more of a flexible plastic substrate, a metal substrate, a semiconductor material.

61. The device of claim 1, further comprising a hole transport layer disposed between the luminescent material and the first electrode strips.

62. The device of claim 61, further comprising a hole injection layer disposed between the hole transport layer and the first electrode strips.

63. The device of claim 1, further comprising an electron transport layer disposed between the luminescent material and the second electrode strips.

64. The device of claim 63, further comprising an electron injection layer disposed between the electron transport layer and the second electrode strips.

65. The device of claim 54, further comprising a hole transport layer disposed between the luminescent material and the second electrode strips.

66. The device of claim 65, further comprising a hole injection layer disposed between the hole transport layer and the second electrode strips.

67. The device of claim 54, further comprising an electron transport layer disposed between the luminescent material and the first electrode strips.

68. The device of claim 54, further comprising an electron injection layer disposed between the electron transport layer and the first electrode strips.

69. The device of claim 2, wherein each of the pixels in the rectilinear matrix has drive circuit associated with it.

70. The device of claim 69, wherein each of the pixel drive circuits addresses a single pixel, each pixel having the electrode strip that functions as its anode electrically isolated from all of the other pixel anodes, all of the pixel electrode strips that function as cathodes being connected in common.

71. The device of claim 69, wherein each pixel drive circuit comprises two or more thin film transistors.

72. The device of claim 71, wherein a first thin film transistor has its drain electrically connected to one of the first electrode strips and the second electrode strips of a single pixel that functions as an anode, and its source electrically connected to a current source bus line.

73. The device of claim 72, wherein a second thin film transistor has its drain electrically connected to a gate of the first thin film transistor, its source connected to a data bus and its gate connected to a row select line.

74. The device of claim 69, wherein the first feedback layer for a pixel is shaped as a mesa covering at least part of the pixel drive circuit and at least part of the substrate.

75. The device of claim 74, wherein a pixel anode to thin film transistor interconnection is formed on a side of the mesa.

76. The device of claim 74, wherein the pixel drive circuits are formed on a raised ribs formed on the substrate.

77. The device of claim 32, wherein one or more of the luminescent materials has a broad spectral band emission that can be used in the domains or areas of the luminescent material located corresponding to domains or areas in the first feedback layer or the second feedback layer or both the first feedback layer and the second feedback layer that have plane wave interference patterns corresponding to different wavelengths of light.

78. The device of claim 39, wherein one or more of the luminescent materials has a broad spectral band emission that can be used in the areas of the luminescent material located corresponding to areas in the first feedback layer or the second feedback layer or both the first feedback layer and the second feedback layer that have plane wave interference patterns corresponding to different wavelengths of light.

79. The device of claim 1, wherein the luminescent material comprises liquid crystalline material.

80. The device of claim 1, wherein the luminescent material comprises cross-linked material.

81. The device of claim 1, wherein the structure comprising the electrodes, semiconductor and light emissive layers is formed in a defect in a continuous photonic crystal formed by the first feedback layer and the second feedback layer.

82. The device of claim 81, wherein the defect comprises a phase-slip in a spatial phase of the photonic crystal of less than one wavelength.

83. The device of claim 81, wherein the light emitted from the layer of light emissive material emanates into a defect mode.

84. The device of claim 81, wherein the photonic crystal structure includes one-dimensional, two-dimensional, or three-dimensional photonic crystal structures or combinations thereof.

85. The device of claim 1, wherein the imaging element comprises a projection lens.

86. The device of claim 1, wherein the imaging element comprises a rear projection screen.

87. The device of claim 85, wherein the projection lens comprises a compound lens.

88. The device of claim 1, wherein all light emitted by the device occupies a single light propagation mode.

89. The device of claim 88, wherein spacing between the first feedback layer and the second feedback layer is equivalent to $\lambda/2$ excluding phase shifts due to reflection, $\lambda$ being a wavelength of the light in the single light propagation mode.

90. A display device, comprising:
a first feedback layer adapted to receive and reflect light;
one or more first electrode strips formed over the first feedback layer;
one or more semiconducting layers formed over the first electrode strips, at least one of the one or more semiconducting layers comprising at least a luminescent material;
one or more second electrode strips formed over the luminescent material the second electrode strips being formed such that they overlay one or more of the first electrode strips, wherein an area where the first electrode strip and the second electrode strip overlap comprises a segment area capable of being driven via the first electrode strips and the second electrode strips;
a second feedback layer adapted to receive and reflect light disposed over the one or more second electrode strips; and
an imaging element disposed proximate to one of the first feedback layer and the second feedback layer,
wherein one or both of the first feedback layer and the second feedback layer has a refractive index profile that varies at least in part periodically alone an axis normal or substantially normal to a plane of a respective feedback layer; and
wherein one or both of the first feedback layer and the second feedback layer that have substantially periodically varying refractive index profiles have at least in part continuously varying refractive index profiles.

* * * * *